United States Patent
Park et al.

(10) Patent No.: US 8,841,665 B2
(45) Date of Patent: Sep. 23, 2014

(54) METHOD FOR MANUFACTURING OXIDE THIN FILM TRANSISTOR

(71) Applicant: Electronics and Telecommunications Research Institute, Daejeon (KR)

(72) Inventors: Sang Hee Park, Daejeon (KR); Min Ki Ryu, Daejeon (KR); Him Chan Oh, Seoul (KR); Chi Sun Hwang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 47 days.

(21) Appl. No.: 13/849,111

(22) Filed: Mar. 22, 2013

(65) Prior Publication Data

US 2013/0264564 A1 Oct. 10, 2013

(30) Foreign Application Priority Data

Apr. 6, 2012 (KR) .................. 10-2012-0035996
Feb. 18, 2013 (KR) .................. 10-2013-0017100

(51) Int. Cl.
| | | |
|---|---|---|
| *H01L 21/16* | (2006.01) | |
| *H01L 21/76* | (2006.01) | |
| *H01L 21/00* | (2006.01) | |
| *H01L 29/786* | (2006.01) | |
| *H01L 29/66* | (2006.01) | |

(52) U.S. Cl.
CPC ...... *H01L 29/7869* (2013.01); *H01L 29/66742* (2013.01)
USPC ...... 257/43; 257/E29.296; 438/168; 438/424; 438/104

(58) Field of Classification Search
USPC ............. 257/43, E29.296; 438/168, 424, 104
See application file for complete search history.

(56) References Cited

U.S. PATENT DOCUMENTS 7,812,346 B2  10/2010 Shieh et al.
8,017,045 B2 *  9/2011 Cho et al. .................. 252/519.51

(Continued)

FOREIGN PATENT DOCUMENTS

KR  10-2007-0107219 A  11/2007

OTHER PUBLICATIONS

Minkyu Kim et al., "High mobility bottom gate InGaZnO thin film transistors with SiO$_x$ etch stopper", Applied Physics Letters, May 2007, pp. 212114-212114-3, vol. 90, Issue 21.

(Continued)

*Primary Examiner* — Evan Pert
*Assistant Examiner* — Gustavo Ramallo
(74) *Attorney, Agent, or Firm* — Rabin & Berdo, P.C.

(57) ABSTRACT

Disclosed is a method for manufacturing an oxide thin film transistor, including: forming a gate electrode on a substrate on which a buffer layer is formed; forming a gate insulation layer on an entire surface of the substrate on which the gate electrode is formed; forming an oxide semiconductor layer on the gate insulation layer; forming a first etch stop layer on the oxide semiconductor layer; forming a second etch stop layer on the first etch stop layer by an atomic layer deposition method; patterning the first etch stop layer and the second etch stop layer, or forming a contact hole, through which a part of the oxide semiconductor layer is exposed, in the first etch stop layer and the second etch stop layer; forming a source electrode and a drain electrode on the first etch stop layer and the second etch stop layer; and forming a passivation layer on the entire surface of the substrate on which the source electrode and the drain electrode are formed.

23 Claims, 5 Drawing Sheets

(56) References Cited

U.S. PATENT DOCUMENTS

| | | | |
|---|---|---|---|
| 8,053,836 B2 | 11/2011 | Yeh et al. | |
| 8,143,093 B2 * | 3/2012 | Ye | 438/104 |
| 8,298,879 B2 * | 10/2012 | Ye | 438/149 |
| 8,455,869 B2 * | 6/2013 | Seo et al. | 257/43 |
| 8,759,917 B2 * | 6/2014 | Park et al. | 257/347 |
| 2004/0241947 A1 | 12/2004 | Wilk et al. | |
| 2009/0057663 A1 * | 3/2009 | Kim et al. | 257/43 |
| 2009/0230389 A1 * | 9/2009 | Chen et al. | 257/43 |
| 2009/0294764 A1 * | 12/2009 | Kim et al. | 257/43 |
| 2009/0321732 A1 | 12/2009 | Kim et al. | |
| 2010/0084649 A1 * | 4/2010 | Seo et al. | 257/43 |
| 2011/0266542 A1 * | 11/2011 | Ryu et al. | 257/57 |
| 2012/0126223 A1 * | 5/2012 | Maeng et al. | 257/43 |

OTHER PUBLICATIONS

Elvira M. C. Fortunato et al., "High mobility indium free amorphous oxide thin film transistors", Applied Physics Letters, Jun. 2008, pp. 222103-222103-3, vol. 92, Issue 22.

* cited by examiner

METHOD FOR MANUFACTURING OXIDE THIN FILM TRANSISTOR

CROSS-REFERENCE TO RELATED APPLICATIONS

This application is based on and claims priority from Korean Patent Application Nos. 10-2012-0035996, filed on Apr. 6, 2012, and 10-2013-0017100, filed on Feb. 18, 2013, with the Korean Intellectual Property Office, the disclosure of which is incorporated herein in its entirety by reference.

TECHNICAL FIELD

The present disclosure relates to an oxide thin film transistor, and more particularly, to a method for manufacturing an oxide thin film transistor by which the oxide thin film transistor used as a driving element of a flat panel display, such as an TFT-LCD and an AMOLED, may have a stable characteristic.

BACKGROUND

As demands for a display have been recently expanded to a large-area and high-resolution TV, a 3D TV, an autostereoscopic TV, a large AMOLED, a high-resolution table PC, and the like, a high characteristic for a thin film transistor (hereinafter, referred to as a "TFT") that is a driving element has been demanded.

It is necessary to stably manufacture the element in a large-area and high-resolution display in response to demands for competitive price, and such a demand induces people to have interests in an oxide TFT having an oxide semiconductor as an active layer, rather than an a-Si TFT or a low temperature poly silicon (LPTS) TFT based on Si. Development of the oxide TFT has greatly advanced in the last 5 to 8 years, so that a UD-level 3D TV with 70 inches was developed in 2011. An AMOLED having 55 inches driven with the oxide TFT was produced in 2012.

One of the most important factors for manufacturing a large-area and large-resolution display is an oxide TFT with high mobility. The mobility of the oxide TFT is closely related to a quantity of carriers inside a semiconductor. The mobility of the oxide TFT tends to be increased as the quantity of carriers is increased. However, since the increase of the quantity of carriers induces negative shift of a threshold voltage Vth, as well as the increase of the mobility, there is a technical limit in obtaining the oxide TFT having a high mobility characteristic. Especially, oxygen deficiency Vo and hydrogen inflow into the semiconductor are widely known as main factors of generating the carriers inside the oxide semiconductor. Accordingly, it is very important to manufacture an element so that the oxide TFT may be stably behaved without being influenced by hydrogen, and the like, until a final time point at which the display, such as a TFT-LCD or an AMOLED, is completely manufactured. The oxide TFT is sensitive to moisture, and the like, so that a protection layer is required, and in this case, a most widely used thin film is SiNx. However, since hydrogen inflow has been already generated in a process of depositing SiNx, the threshold voltage Vth of the oxide TFT is negatively shifted. Especially, since the oxide TFT having high mobility is in a state in which the quantity of carriers within the semiconductor is already increased in order to make a high mobility state, an element characteristic may sensitively react by inflow of a small quantity of hydrogen, and thus uniformity of an entire panel deteriorates, thereby decreasing a yield. Accordingly, a technology capable of preventing hydrogen inflow when forming the protection layer of the oxide TFT with high mobility is highly required.

In the meantime, when the AMOLED is manufactured, an OLED itself is sensitive to moisture, so that a protection layer for passivating the OLED is formed. In this case, even though the OLED is formed in a top emission type or a bottom emission type after an oxide TFT array is formed, a part of the oxide TFT may be exposed to the passivation process of the OLED, so that an oxide TFT stable even in a process of forming the protection layer of the OLED is demanded.

SUMMARY

The present disclosure has been made in an effort to provide a method for manufacturing an oxide thin film transistor capable of maintaining an oxide TFT characteristic with high mobility and high quality without being influenced by a subsequent process until a time point at which a panel is completely manufactured when an oxide TFT having various structures is manufactured.

The present disclosure has also been made in an effort to provide a method for manufacturing an oxide thin film transistor, which is applied to all of oxide TFTs, as well as an oxide TFT with high mobility, thereby capable of improving a manufacturing yield by manufacturing a stable panel in which a threshold voltage Vth is not changed.

The present disclosure has also been made in an effort to provide a method for manufacturing an oxide thin film transistor capable of securing an excellent barrier characteristic for hydrogen, oxygen, vapor, and the like, even only with a dual etch stop layer (ESL) including an alumina thin film, and the like, manufactured by an atomic layer deposition (ALD) method.

The present disclosure has also been made in an effort to provide a method for manufacturing an oxide thin film transistor capable of securing an excellent element characteristic even though a SiNx passivation process inducing hydrogen inflow is performed on the oxide TFT with high mobility and an electrode structure in which a surface of Cu is directly exposed or an organic planarization layer is directly coated on the TFT array while a structure of a Cu electrode used for manufacturing a large area display employs a bi-layered structure, such as a bi-layered structure of an Cu/Mo—Ti alloy, a bi-layered structure of Cu/Mo, and a bi-layered structure of Cu/Ti, not a triple structure (for example, Mo/Cu/Mo), thereby obtaining stability of the element, and capable of progressing an etching process of electrode with one process by adopting a low resistance Cu based electrode having the bi-layered structure.

The present disclosure has also been made in an effort to provide a method for manufacturing an oxide thin film transistor, which is applied to an oxide TFT having a dual gate electrode, thereby securing a high current quantity in an element having the same semiconductor.

The present disclosure has also been made in an effort to provide a method for manufacturing an oxide thin film transistor, which provides an oxide TFT with high stability and high performance close to a characteristic of a low-temperature poly-silicon (LTPS) TFT, thereby further improving applicability for a next-generation display.

In order to achieve the aforementioned object, in the exemplary embodiments of the present disclosure, an oxide TFT may be generally divided into 1) an ESL type inverted staggered oxide TFT (ESL oxide TFT) including an etch stop layer (ESL) in an inverted staggered type oxide TFT, 2) a back channel etch type inverted staggered oxide TFT (BCE oxide TFT) including no etch stop layer in an inverted staggered type oxide TFT, 3) an inverted coplanar type oxide TFT (inverted coplanar oxide TFT), 4) a staggered oxide TFT, and 5) a coplanar type oxide TFT (coplanar oxide TFT).

The ESL oxide TFT may be manufactured by a total of five methods, but in the exemplary embodiments of the present disclosure, an island type ESL oxide TFT and a contact type ESL oxide TFT will be described as an example.

A first exemplary embodiment of the present disclosure provides a method for manufacturing an island type ESL oxide TFT including: forming a gate electrode by depositing the gate electrode on a substrate on which a buffer layer is formed or a buffer layer is not formed and patterning the gate electrode; depositing a gate insulation layer on the substrate on which the gate electrode is formed; forming an oxide semiconductor layer by depositing the oxide semiconductor layer on the gate insulation layer and patterning the oxide semiconductor layer; depositing a first etch stop layer on the oxide semiconductor layer; forming the second etch stop layer by depositing the second etch stop layer on the first etch stop layer by an atomic layer deposition method, and patterning the first etch stop layer and the second etch stop layer to the ESL having an island shape; forming a source electrode and a drain electrode at both sides of the formed double etch stop layer; and forming a passivation layer on an entire surface of the substrate on which the source electrode and the drain electrode are formed.

In the forming of the second etch stop layer, the second etch stop layer may be formed through surface chemical reaction using any one atomic layer deposition method among a traveling wave reactor type deposition method, a remote plasma atomic layer deposition method, and a direct plasma atomic layer deposition method.

The second etch stop layer may be a single layer or a multilayer including at least one of $Al_2O_3$, $SiO_2$, SiNx, SiON, $HfO_2$, $ZrO_2$, and $TiO_2$.

A thickness of the second etch stop layer may be 3 to 100 nm.

The first etch stop layer may be an insulation layer having selectivity of dry etching or wet etching with the oxide semiconductor layer.

In the forming of the passivation layer, the passivation layer may be formed by forming alumina by the atomic layer deposition method, and then forming an insulation layer including SiNx or $SiO_2$ on the alumina.

A thickness of the alumina may be 3 to 100 nm.

The oxide semiconductor layer may be a single layer or a multilayer, or a multilayer deposited as two layers by changing oxygen partial pressure in a case of a single oxide semiconductor layer, or a single layer formed by performing thermal treatment on the multilayer.

The island type ESL oxide TFT according to the first exemplary embodiment of the present disclosure may be manufactured by depositing a channel protection layer on the oxide semiconductor layer and then patterning the oxide semiconductor layer and the channel protection layer at once.

A contact type ESL oxide TFT according to the second exemplary embodiment of the present disclosure may be in contact with the oxide semiconductor layer through a contact hole so as for the source/drain electrode to apply bias after forming an etch stop layer on an entire surface of the oxide semiconductor layer. Even in this case, the channel protection layer is formed on the oxide semiconductor layer before forming the etch stop layer, and then a pattern is formed by using a semiconductor mask to form the etch stop layer.

A third exemplary embodiment of the present disclosure provides a method for manufacturing an inverted staggered oxide TFT including: forming a gate electrode by depositing the gate electrode on a substrate on which a buffer layer is formed and patterning the gate electrode; depositing a gate insulation layer on the substrate on which the gate electrode is formed; forming an oxide semiconductor layer on the gate insulation layer; forming a source electrode and a drain electrode at both sides of the oxide semiconductor layer; forming a first passivation layer by an atomic layer deposition method on the substrate on which the source electrode and the drain electrode are formed; and forming a second passivation layer on the first passivation layer.

A fourth exemplary embodiment of the present disclosure provides a method for manufacturing an oxide thin film transistor including: forming a gate electrode on a substrate on which a buffer layer is formed; forming a gate insulation layer on an entire surface of the substrate on which the gate electrode is formed; forming a source electrode and a drain electrode on surfaces of the gate insulation layer; forming an oxide semiconductor layer between the source electrode and the drain electrode; forming a first passivation layer by an atomic layer deposition method on the substrate on which the oxide semiconductor layer is formed; and forming a second passivation layer on the first passivation layer.

A fifth exemplary embodiment of the present disclosure provides a method for manufacturing an oxide thin film transistor including: forming a source electrode and a drain electrode on a substrate on which a buffer layer is formed; forming an oxide semiconductor layer on the source electrode and the drain electrode; forming a gate insulation layer on the substrate on which the oxide semiconductor layer is formed; forming a gate electrode on the gate insulation layer; forming a first passivation layer by an atomic layer deposition method on the substrate on which the gate electrode is formed; and forming a second passivation layer on the first passivation layer.

According to the aforementioned exemplary embodiments of the present disclosure, it is possible to provide a method for manufacturing an oxide thin film transistor, by which an etch stop layer or a passivation layer is formed by an atomic layer deposition method according to a structure of an oxide TFT so that the oxide TFT of various structures may maintain a high mobility characteristic, thereby achieving an effect that it is possible to prevent hydrogen from flowing into an oxide semiconductor during a subsequent process after the oxide semiconductor is formed, and thus it is possible to minimize a change in a threshold voltage Vth according to a change in a quantity of carrier within the semiconductor.

According to the exemplary embodiments of the present disclosure, it is possible to provide a method for manufacturing an oxide thin film transistor, by which an etch stop layer is formed by an atomic layer deposition method regardless of an island type or a contact type, thereby securing an excellent barrier characteristic for hydrogen, and forming a passivation layer, such as SiN or an organic material layer, by a process including no oxidizing reaction. Even though an organic material planarization layer is directly coated without a passivation layer, a characteristic of an element is not changed, so that it is possible to use a bi-layered structure (for example, Mo/Cu) in which Cu as source/drain electrodes is directly exposed in manufacturing a large area display, thereby smoothly performing a patterning process of the Cu-based electrodes.

According to the exemplary embodiments of the present disclosure, it is possible to provide a method for manufacturing an oxide thin film transistor, by which variation of threshold voltages Vth is minimized when a TFT is manufactured on a large area substrate, thereby capable of obtaining an oxide TFT with high mobility having a uniform characteristic, and thus suppressing a mura from being generated in an AMOLED.

According to the exemplary embodiments of the present disclosure, it is possible to provide a method for manufacturing an oxide thin film transistor, in which a SiN thin film having an excellent barrier characteristic is used as a protection layer for protecting an oxide TFT sensitive to moisture, thereby minimizing a characteristic change of the oxide TFT when the oxide TFT is exposed to electrical or electrical/optical stress.

According to the exemplary embodiments of the present disclosure, it is possible to provide a method for manufacturing an oxide thin film transistor, in which SiN having an excellent barrier characteristic is used as a protection layer when a passivation layer of an OLED is formed in a manufacturing process of an AMOLED, thereby extending a life span of the OLED.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Hereinafter, exemplary embodiments of the present disclosure will be described in detail with reference to the accompanying drawings. In the following description of the present disclosure, a detailed description of known configurations or functions incorporated herein will be omitted when it is determined that the detailed description may make the subject matter of the present disclosure unclear.

In general, an atomic layer deposition (ALD) method is a deposition method of absorbing molecules onto a surface of a substrate by using chemical bonding, and then reacting a precursor absorbed through a surface chemical reaction, such as substitution, combustion, and protonation, with a subsequent precursor. Since absorption and substitution are alternately performed (a cycle is repeated) in the ALD method, ultrafine layer-by-layer deposition is available and an oxide may be stacked as thin as possible.

Accordingly, a thin film in the ALD method is formed by using the surface chemical reaction in the unit of an atomic layer, so that a quality of thin film is very minute, so that the thin film may be used as a protection layer of an OLED device for preventing moisture and oxygen from passing through. When an insulation layer, such as $Al_2O_3$ and $SiO_2$, deposited by the ALD method is used as a part of the passivation layer or a part of an etch stop layer of an oxide thin film transistor (hereinafter, referred to as a "TFT"), the insulation layer may prevent the hydrogen from permeating into an oxide semiconductor layer of the TFT even though the TFT is exposed during a subsequent deposition process using a source including hydrogen, such as $NH_3$ and $SH_4$.

The ALD method is divided into a traveling wave reactor type deposition method, a plasma enhanced atomic layer deposition method, and the like. Here, the plasma enhanced atomic layer deposition method may be divided into a remote plasma atomic layer deposition method and a direct plasma atomic layer deposition method according to a plasma generation device.

FIGS. 1A to 1I are flow charts illustrating a method for manufacturing an island type etch stop layer (ESL) oxide TFT according to a first exemplary embodiment of the present disclosure.

Figure 1A:
FIGS. 1A to 1I are flow charts illustrating a method for manufacturing an island type ESL oxide TFT according to a first exemplary embodiment of the present disclosure.

Referring to FIG. 1A, a buffer layer 110 is formed on a substrate 100. The substrate 100 may be glass, plastic, paper, and a metal foil on which a planarization layer and an insulation layer are coated. The buffer layer 100 may include at least one of $SiO_1$, SiN, and $Al_2O_3$.

Figure 1B:
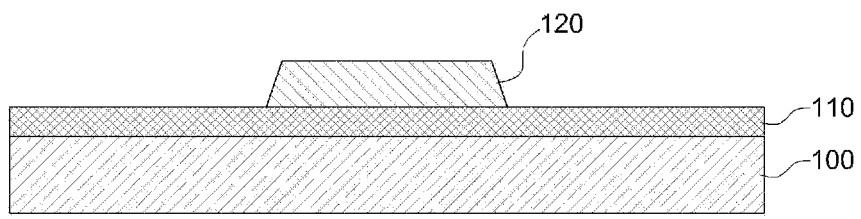

Referring to FIG. 1B, a gate electrode 120 is formed on the substrate 100 on which the buffer layer 110 is formed. The gate electrode 120 may be an electrode formed of a metal, such as Mo and Mo/Al/Mo, or an alloy thereof, a low-resistance electrode based on Cu or Ag, and a multilayer including a transparent electrode and a metal.

Figure 1C:
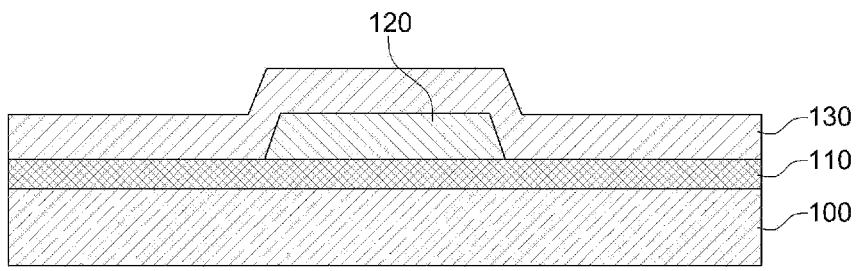

Referring to FIG. 1C, a gate insulation layer 130 is formed on an entire surface of the substrate 100 on which the gate electrode 120 is formed. The gate insulation layer 130 may include a single layer or a multilayer including at least one of SiOx, SiNx, and alumina, and an organic/inorganic hybrid complex as an insulation layer having an excellent insulation characteristic, and the like.

Figure 1D:
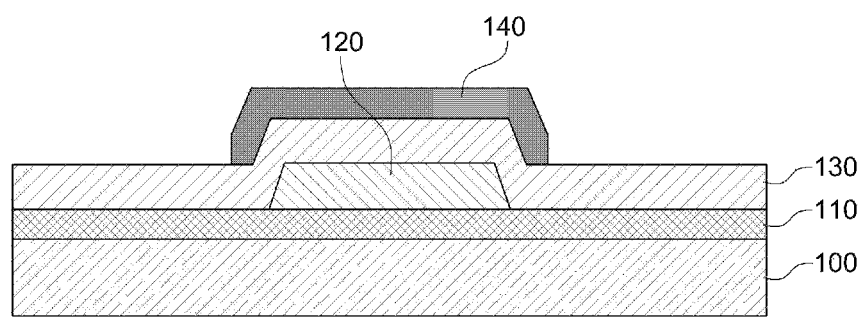

Referring to FIG. 1D, an oxide semiconductor layer 140 is formed on the gate insulation layer 130. The oxide semiconductor layer 140 may include a single layer or a multilayer including at least one of IGZO, GSZO, ZnInSnO, InZnSnAlO, IGO, and ZnSnO, and an oxide semiconductor with high mobility, and an oxide semiconductor with high mobility formed in a single layer of an oxide semiconductor including a specific composition or a multilayer of an oxide semiconductor including multiple compositions.

Figure 1E:
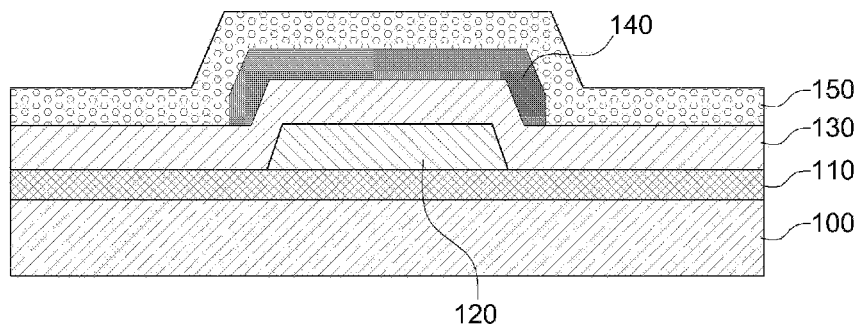

Referring to FIG. 1E, a first etch stop layer 150 is formed on the oxide semiconductor layer 140. The first etch stop layer 150 may be an insulation layer including $SiO_2$ and a small content of H, an insulation layer having selectivity of dry etching or wet etching with the oxide semiconductor layer 140, and the like.

Figure 1F:
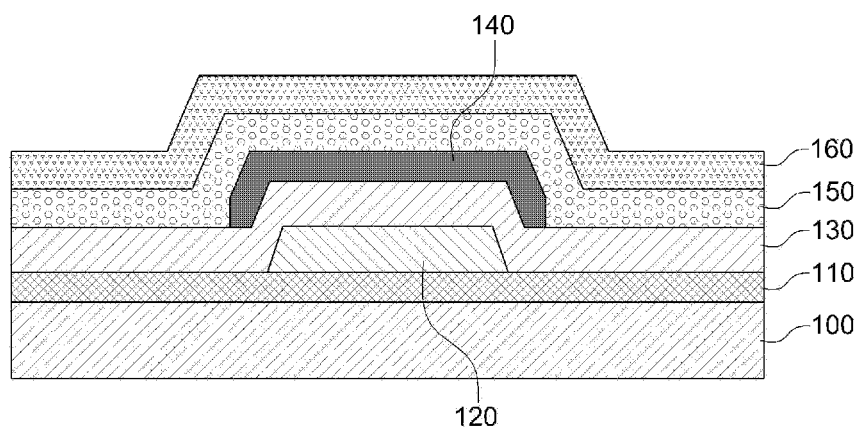

Referring to FIG. 1F, a second etch stop layer 160 is formed on the first etch stop layer 150 by the ALD method. Here, the ALD method may be a traveling wave reactor type deposition method, a remote plasma atomic layer deposition method, a direct plasma atomic layer deposition method, and the like. In this case, various sources, such as water, oxygen, plasma, ozone, $N_2O$ plasma, and $CO_2$ plasma, may be used as sources of oxygen used in the deposition of the oxide insulation layer, and the plasma source may be directly generated inside the plasma reactor (direct plasma), or may be generated outside the reactor and transported to the reactor (remote plasma).

The second etch stop layer 160 may be a single layer or a multilayer including at least one of $Al_2O_3$, $SiO_2$, SiNx, and SiON, and a thickness of the second etch stop layer 160 may be 3 to 7 nm.

In the first exemplary embodiment of the present disclosure, the etch stop layers 150 and 160 of a dual layer are formed. The reason is that the etch stop layers of the dual layer are used for securing selectivity because it is difficult to obtain etch selectivity between the alumina and the oxide semiconductor when alumina is used as the etch stop layer. However, when $SiO_2$ is deposited as the etch stop layer through the ALD method, the etch stop layer may not be formed in a bi-layered structure, but may be formed in a single layer of $SiO_2$.

Figure 1G:
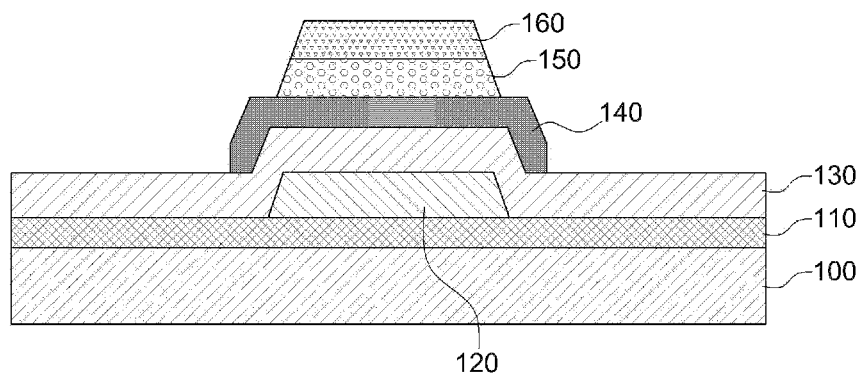

Referring to FIG. 1G, the first etch stop layer 150 and the second etch stop layer 160 are simultaneously patterned.

Figure 1H:
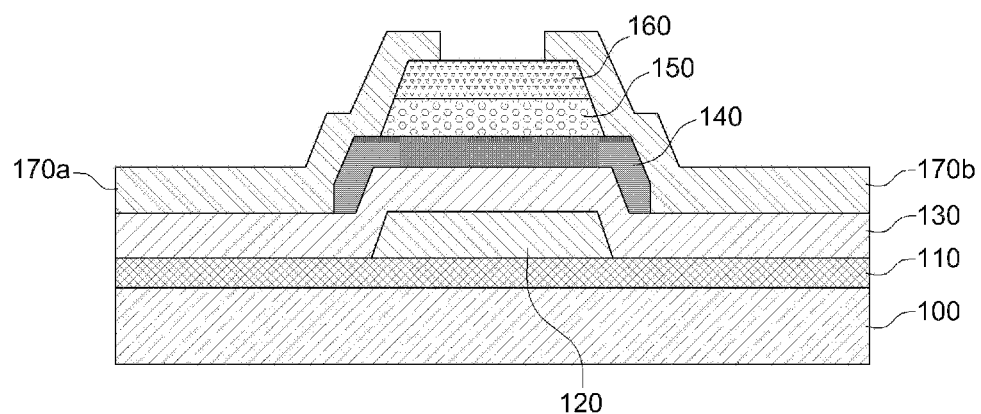

Referring to FIG. 1H, a source electrode 170a and a drain electrode 170b are formed at both sides of the patterned first etch stop layer 150 and second etch stop layer 160. The source electrode 170a and the drain electrode 170b may be electrodes of a dual layer or a triple layer including a pure metal, such as Mo and Mo/Al/Mo or an alloy thereof, and Cu, or low-resistance electrodes based on Ag, and electrodes including a multilayer of a transparent electrode and a metal. Especially, when a Cu electrode is used as the source electrode 170a and the drain electrode 170b, Cu having a Cu electrode structure of a dual layer may be formed and an organic material protection layer or a SiN protection layer may be directly formed by first forming a Cu barrier layer at a portion which is in contact with the oxide semiconductor layer 140 and then forming the Cu layer on the Cu bather layer.

Figure 1I:
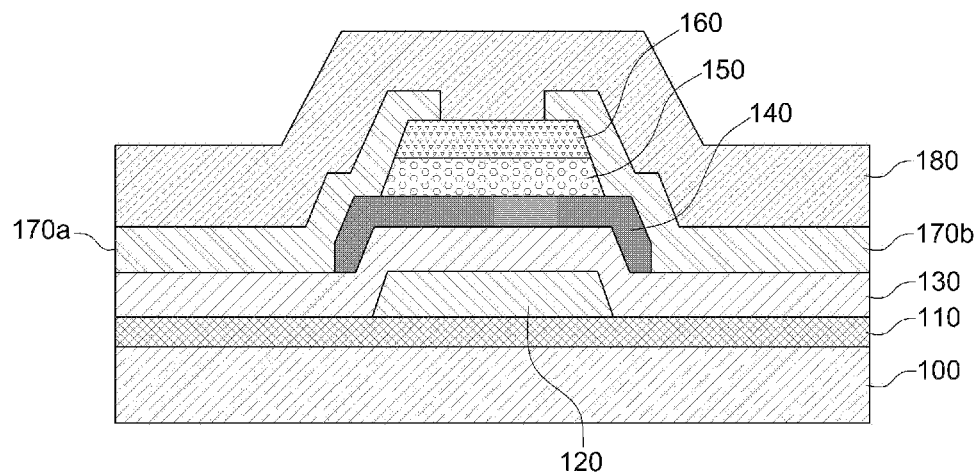

Referring to FIG. 1I, a passivation layer 180 is formed on an entire surface of the substrate 100 on which the source electrode 170a and the drain electrode 170b are formed. In this case, the passivation layer 180 is formed by forming alumina through the ALD method on the contrary to the etch stop layers 150 and 160, and then forming an insulation layer including SiNx or $SiO_2$ on the alumina. The passivation layer 180 may be formed as a single layer or a dual layer including SiNx and $SiO_2$. A configuration of the passivation layer 180 is determined according to a barrier characteristic of the second etch stop layer 160 formed by the ALD method, and when alumina as the second etch stop layer 160 is deposited with a thickness of 20 nm or more, it is possible to prevent hydrogen inflow in a subsequent process in itself, so that the passivation layer 180 may not be formed as a dual layer, but may be formed as a single layer by the plasma enhanced chemical vapor deposition (PECVD) or other deposition methods.

Figure 1J:
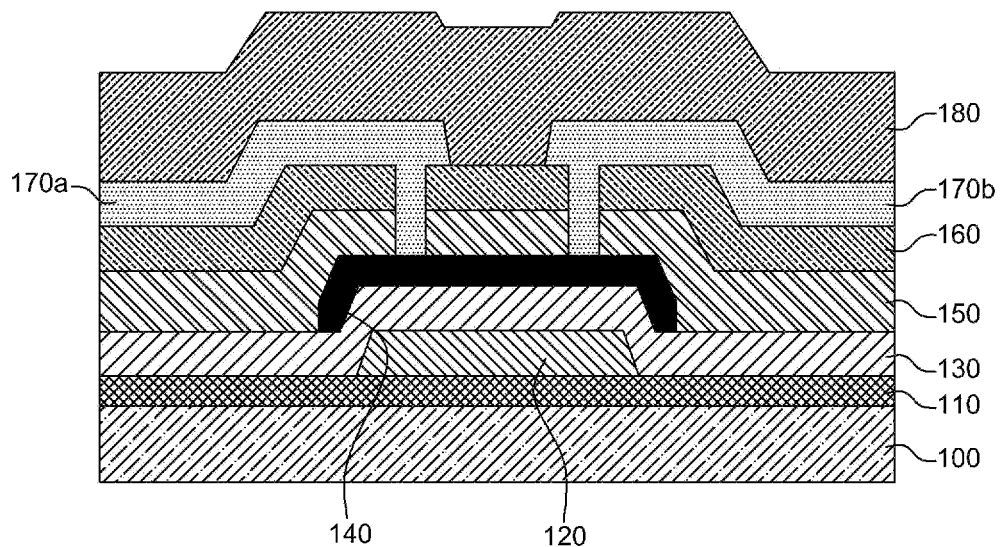
FIG. 1J is a view for describing a method for manufacturing a contact type ESL oxide TFT according to a second embodiment of the present disclosure.

In the second embodiment according to the present disclosure, a contact type ESL oxide TFT is manufactured by forming the etch stop layers 150 and 160 on the entire surface of the substrate 100 as illustrated in FIG. 1J, forming a contact hole 160a through the etch stop layer so that the oxide semiconductor layer 140 and the source/drain electrodes 170a and 170b are in contact, and then depositing the aforementioned source/drain electrodes 170a and 170b on the entire surface of the substrate 100, not by patterning the etch stop layers 150 and 160 in an island shape as illustrated in FIG. 1G. In this case, the passivation layer 180 is formed by the same method as that of the island type ESL oxide TFT.

Figure 2:
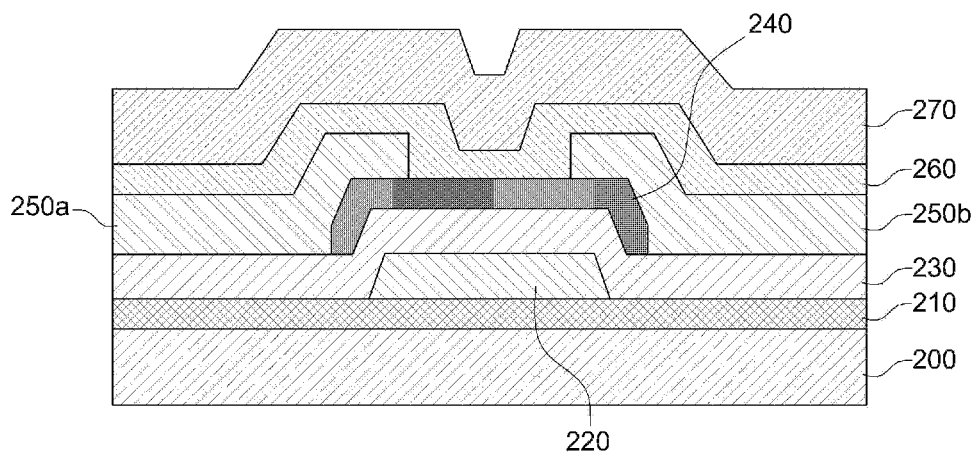
FIG. 2 is a view for describing a method for manufacturing a back channel etch (BCE) type oxide TFT according to a third exemplary embodiment of the present disclosure.

FIG. 2 is a view for describing a method for manufacturing a back channel etch (BCE) type oxide TFT according to a third exemplary embodiment of the present disclosure.

Referring to FIG. 2, configurations from a substrate 200 to an oxide semiconductor layer 240 in the BCE type oxide TFT according to the third exemplary embodiment of the present disclosure are the same as those of the bottom gate type oxide TFT of FIG. 1, so that those descriptions will be omitted.

In the BCE type oxide TFT, the oxide semiconductor layer 240 is directly exposed during the etching process of a source electrode 250a and a drain electrode 250b, so that a carrier quantity in the semiconductor may be further increased.

Accordingly, a characteristic of the oxide TFT may be recovered through a post treatment process, such as $N_2O$ plasma processing, before a first passivation layer 260 is deposited.

In the BCE type oxide TFT, the first passivation layer 260 formed of alumina is formed by the ALD method similar to the passivation layer 180 of the bottom gate type oxide TFT of FIG. 1, and then a second passivation layer 270 formed of an insulation layer including SiNx or $SiO_2$ is formed. In this case, the first passivation layer 260 may be deposited with a thickness of 3 to 70 nm, and even though the first passivation layer 260 is deposited with a thickness of 50 nm or smaller, it is possible to prevent hydrogen from flowing into the oxide semiconductor layer 240 in a subsequent process of forming the second passivation layer 270.

Figure 3:
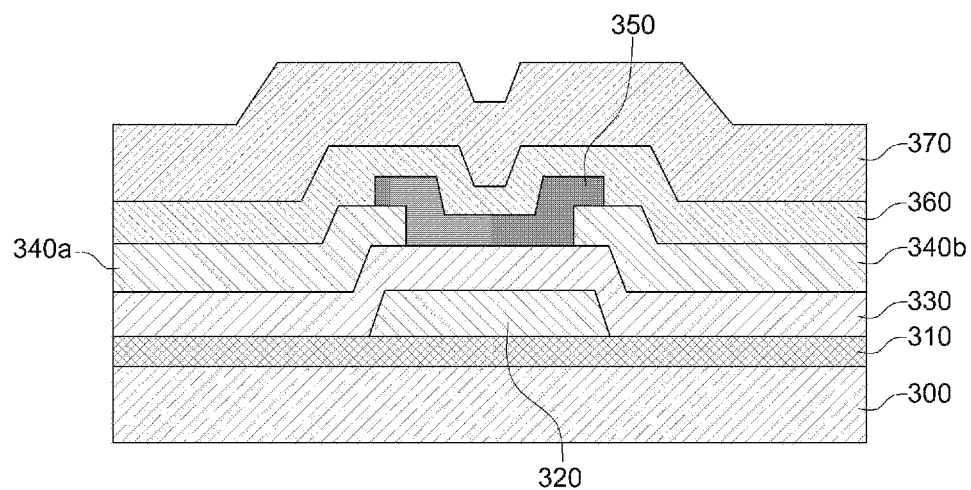
FIG. 3 is a view for describing a method for manufacturing a bottom gate bottom contact type oxide TFT according to a fourth exemplary embodiment of the present disclosure.

FIG. 3 is a view for describing a method for manufacturing a bottom gate bottom contact type oxide TFT according to a fourth exemplary embodiment of the present disclosure.

Referring to FIG. 3, configurations from a substrate 300 to a gate insulation layer 330 in the bottom gate bottom contact type oxide TFT according to the fourth exemplary embodiment of the present disclosure are the same as those of the bottom gate type oxide TFT of FIG. 1, so that those descriptions will be omitted.

A source electrode 340a and a drain electrode 340b are first formed before an oxide semiconductor layer 350 is deposited in the bottom gate bottom contact type oxide TFT. In this case, in order to achieve an excellent contact characteristic, an oxide metal or a metal layer may be used as the source electrode 340a and the drain electrode 340b. To this end, a technology of simultaneously forming a semiconductor and a semiconductor protection layer and then performing patterning with the same mask may be used.

In the bottom gate bottom contact type oxide TFT, a first passivation layer 360 formed of alumina is formed by the ALD method similar to the passivation layer 180 of the bottom gate type oxide TFT of FIG. 1, and then a second passivation layer 370 formed of an insulation layer including SiNx or $SiO_2$ is formed. In this case, even though the first passivation layer 360 is deposited with a thickness of 50 nm or smaller, it is possible to prevent hydrogen from flowing into the oxide semiconductor layer 350 in a subsequent process of forming the second passivation layer 370.

Figure 4:
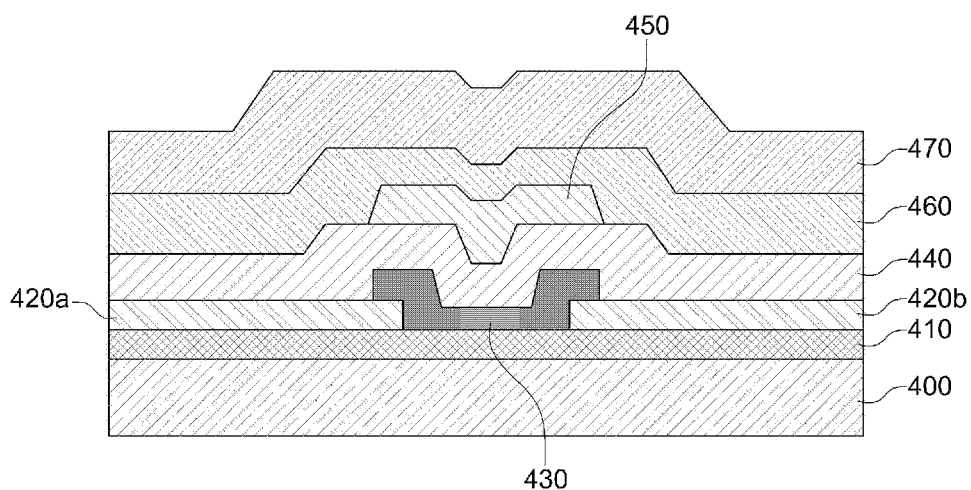
FIG. 4 is a view for describing a method for manufacturing a top gate bottom contact type oxide TFT according to a fifth exemplary embodiment of the present disclosure.

FIG. 4 is a view for describing a method for manufacturing a top gate bottom contact type oxide TFT according to a fifth exemplary embodiment of the present disclosure.

Referring to FIG. 4, in the top gate bottom contact type oxide TFT according to the fifth exemplary embodiment of the present disclosure, a protection layer (not illustrated) is formed on an oxide semiconductor layer 430, the oxide semiconductor layer 430 and the protection layer (not illustrated) are patterned at once, and then a gate insulation layer 440 is formed. In this case, SiO2 and the like capable of minimizing hydrogen inflow during the process may be used as the gate insulation layer 440.

In the top gate bottom contact type oxide TFT, the first passivation layer 460 and a second passivation layer 470 are formed in the same method as that of the bottom gate bottom contact type oxide TFT of FIG. 3, so that a description thereof will be omitted.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for manufacturing an oxide thin film transistor, comprising:
   forming a gate electrode on a substrate on which a buffer layer is formed;
   forming a gate insulation layer on an entire surface of the substrate on which the gate electrode is formed;
   forming an oxide semiconductor layer on the gate insulation layer;
   forming a first etch stop layer on the oxide semiconductor layer;
   forming a second etch stop layer on the first etch stop layer by an atomic layer deposition method;
   patterning the first etch stop layer and the second etch stop layer, or forming a contact hole, through which a part of the oxide semiconductor layer is exposed, in the first etch stop layer and the second etch stop layer;
   forming a source electrode and a drain electrode on the first etch stop layer and second etch stop layer; and
   forming a passivation layer on the entire surface of the substrate on which the source electrode and the drain electrode are formed.

2. The method of claim 1, wherein in the forming of the second etch stop layer, the second etch stop layer is formed in a form of a thin film through surface chemical reaction using any one atomic layer deposition method among a traveling wave reactor type deposition method, a remote plasma atomic layer deposition method, and a direct plasma atomic layer deposition method.

3. The method of claim 1, wherein the second etch stop layer is a single layer or a multilayer including at least one of AlOx, HfOx, AlON, $TiO_2$, TaOx, SiON, $ZrO_2$, SiOx, SiON, and $Y_2O_3$.

4. The method of claim 1, wherein the passivation layer includes any one of an organic material layer, SiOx, SiNx, and alumina deposited by the atomic layer deposition method, or is formed in a multilayer structure thereof.

5. The method of claim 1, wherein the source electrode and the drain electrode are low-resistance metal electrodes based on Cu.

6. The method of claim 1, wherein the oxide semiconductor layer is a single layer or a multilayer of an oxide semiconductor including at least one of IGZO, GSZO, ZnInSnO, InZnSnAlO, and ZnSnO.

7. An oxide thin film transistor manufactured by the method of claim 1.

8. A method for manufacturing an oxide thin film transistor, comprising:
   forming a gate electrode on a substrate on which a buffer layer is formed;
   forming a gate insulation layer on an entire surface of the substrate on which the gate electrode is formed;
   forming an oxide semiconductor layer on the gate insulation layer;
   forming a source electrode and a drain electrode at both sides of the oxide semiconductor layer;
   forming a first passivation layer by an atomic layer deposition method on an entire surface of the substrate on which the source electrode and the drain electrode are formed; and
   forming a second passivation layer on the first passivation layer.

9. The method of claim 8, wherein in the forming of the first passivation layer, the first passivation layer is formed by any one atomic layer deposition method among a traveling wave reactor type deposition method, a remote plasma atomic layer deposition method, and a direct plasma atomic layer deposition method.

10. The method of claim 8, wherein the source electrode and the drain electrode are low-resistance metal electrodes based on Cu.

11. An oxide thin film transistor manufactured by the method of claim 8.

12. A method for manufacturing an oxide thin film transistor, comprising:
   forming a first gate electrode on a substrate on which a buffer layer is formed;
   forming a gate insulation layer on an entire surface of the substrate on which the first gate electrode is formed;
   forming an oxide semiconductor layer on the gate insulation layer;
   forming a source electrode and a drain electrode at both sides of the oxide semiconductor layer;
   forming a first passivation layer by an atomic layer deposition method on an entire surface of the substrate on which the source electrode and the drain electrode are formed;
   forming a second passivation layer on the first passivation layer; and
   forming a second gate electrode on the second passivation layer.

13. The method of claim 12, wherein in the forming of the first passivation layer, the first passivation layer is formed by any one atomic layer deposition method among a traveling wave reactor type deposition method, a remote plasma atomic layer deposition method, and a direct plasma atomic layer deposition method.

14. The method of claim 12, wherein the source electrode and the drain electrode are low-resistance metal electrodes based on Cu.

15. An oxide thin film transistor manufactured by the method of claim 12.

16. A method for manufacturing an oxide thin film transistor, comprising:
   forming a gate electrode on a substrate on which a buffer layer is formed;
   forming a gate insulation layer on an entire surface of the substrate on which the gate electrode is formed;
   forming a source electrode and a drain electrode on the gate insulation layer;
   forming an oxide semiconductor layer between the source electrode and the drain electrode;
   forming a first passivation layer by an atomic layer deposition method on the entire surface of the substrate on which the oxide semiconductor layer is formed; and
   forming a second passivation layer on the first passivation layer.

17. The method of claim 16, wherein in the forming of the first passivation layer, the first passivation layer is formed by any one atomic layer deposition method among a traveling wave reactor type deposition method, a remote plasma atomic layer deposition method, and a direct plasma atomic layer deposition method.

18. An oxide thin film transistor manufactured by the method of claim 16.

19. A method for manufacturing an oxide thin film transistor, comprising:
   forming a first gate electrode on a substrate on which a buffer layer is formed;
   forming a gate insulation layer on an entire surface of the substrate on which the first gate electrode is formed;

forming a source electrode and a drain electrode on the gate insulation layer;

forming an oxide semiconductor layer between the source electrode and the drain electrode;

forming a first passivation layer formed by an atomic layer deposition method on the entire surface of the substrate on which the oxide semiconductor layer is formed;

forming a second passivation layer on the first passivation layer; and forming a second gate electrode on the second passivation layer.

20. The method of claim 19, wherein in the forming of the first passivation layer, the first passivation layer is formed by any one atomic layer deposition method among a traveling wave reactor type deposition method, a remote plasma atomic layer deposition method, and a direct plasma atomic layer deposition method.

21. An oxide thin film transistor manufactured by the method of claim 19.

22. A method for manufacturing an oxide thin film transistor, comprising:

forming a source electrode and a drain electrode on a substrate on which a buffer layer is formed;

forming an oxide semiconductor layer between the source electrode and the drain electrode;

forming a gate insulation layer on an entire surface of the substrate on which the oxide semiconductor layer is formed;

forming a gate electrode on the gate insulation layer;

forming a first passivation layer by an atomic layer deposition method on the entire surface of the substrate on which the gate electrode is formed; and forming a second passivation layer on the first passivation layer.

23. An oxide thin film transistor manufactured by the method of claim 22.

* * * * *